(12) United States Patent
Gasper, Jr. et al.

(10) Patent No.: US 7,590,961 B2
(45) Date of Patent: Sep. 15, 2009

(54) INTEGRATED CIRCUIT WITH SIGNAL SKEW ADJUSTING CELL SELECTED FROM CELL LIBRARY

(75) Inventors: Martin J. Gasper, Jr., Zionsville, PA (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 60 days.

(21) Appl. No.: 11/774,022

(22) Filed: Jul. 6, 2007

(65) Prior Publication Data
US 2007/0256047 A1  Nov. 1, 2007

Related U.S. Application Data

(62) Division of application No. 10/925,185, filed on Aug. 24, 2004, now abandoned.

(51) Int. Cl.
*G06F 17/50* (2006.01)
(52) U.S. Cl. .............................................. 716/10; 716/6
(58) Field of Classification Search ....................... None
See application file for complete search history.

(56) References Cited

U.S. PATENT DOCUMENTS

| | | | |
|---|---|---|---|
| 5,570,045 A * | 10/1996 | Erdal et al. | 326/93 |
| 5,686,845 A * | 11/1997 | Erdal et al. | 326/93 |
| 5,757,218 A | 5/1998 | Blum | |
| 6,069,511 A | 5/2000 | Mohan | |
| 6,088,415 A | 7/2000 | Gaudet | |
| 6,411,145 B1 | 6/2002 | Kueng et al. | |
| 6,442,737 B1 * | 8/2002 | Tetelbaum et al. | 716/5 |
| 6,507,220 B1 | 1/2003 | Groen et al. | |
| 6,593,792 B2 * | 7/2003 | Fujii | 327/276 |
| 6,594,807 B1 * | 7/2003 | Tetelbaum et al. | 716/6 |
| 6,690,202 B1 | 2/2004 | Groen et al. | |
| 6,698,006 B1 * | 2/2004 | Srinivasan et al. | 716/10 |
| 6,701,507 B1 * | 3/2004 | Srinivasan | 716/10 |
| 6,754,877 B1 * | 6/2004 | Srinivasan | 716/2 |
| 7,017,132 B2 * | 3/2006 | Hou et al. | 716/6 |
| 7,042,269 B2 * | 5/2006 | Kao | 327/295 |
| 7,047,504 B2 * | 5/2006 | Kawano | 716/2 |
| 7,191,418 B2 * | 3/2007 | Lee et al. | 716/6 |

FOREIGN PATENT DOCUMENTS

| | | |
|---|---|---|
| JP | 08-077227 | 3/1996 |
| JP | 2003-152078 | 5/2003 |

* cited by examiner

*Primary Examiner*—Leigh Marie Garbowski
(74) *Attorney, Agent, or Firm*—Ryan, Mason & Lewis, LLP

(57) ABSTRACT

An integrated circuit comprises digital circuitry having at least one digital logic cell and at least one skew adjusting cell. The skew adjusting cell is configured to adjust the skew of a signal in the digital circuitry of the integrated circuit to a desired amount. The digital logic cell and the skew adjusting cell are selected from a cell library.

17 Claims, 3 Drawing Sheets

---

402 — DETERMINE A SKEW OF A SIGNAL IN DIGITAL CIRCUITRY OF AN INTEGRATED CIRCUIT HAVING AT LEAST ONE DIGITAL LOGIC CELL FROM A CELL LIBRARY

404 — INCORPORATE AT LEAST ONE SKEW ADJUSTING CELL FROM THE CELL LIBRARY INTO THE INTEGRATED CIRCUIT

INPUT WAVEFORM AT A
102

OUTPUT WAVEFORM AT Z
106

402 — DETERMINE A SKEW OF A SIGNAL IN DIGITAL CIRCUITRY OF AN INTEGRATED CIRCUIT HAVING AT LEAST ONE DIGITAL LOGIC CELL FROM A CELL LIBRARY

404 — INCORPORATE AT LEAST ONE SKEW ADJUSTING CELL FROM THE CELL LIBRARY INTO THE INTEGRATED CIRCUIT

INTEGRATED CIRCUIT WITH SIGNAL SKEW ADJUSTING CELL SELECTED FROM CELL LIBRARY

CROSS REFERENCE TO REPLATED APPLICATION

This application is a divisional of pending U.S. application Ser. No. 10/925,185, filed Aug. 24, 2004, the disclosure of which is incorporated by reference herein.

FIELD OF THE INVENTION

The present invention relates generally to the field of integrated circuits and, more particularly, to skew adjustment of a signal in digital circuitry of an integrated circuit.

BACKGROUND OF THE INVENTION

Integrated circuit design is typically carried out through computer-assisted design instruments, such as "place and route" CAD systems. In such systems, the layouts of the integrated circuits are defined by standard cells which describe the geometric configurations of the masks needed to produce the various arrangements, orientations and interconnections of circuit elements. The group of standard cells available for designing an integrated circuit in accordance with a given manufacturing technology is commonly referred to as a standard cell library. Standard cell libraries typically comprise a fixed set of logic blocks fully characterized for timing, noise, reliability, etc.

Standard cell libraries available commercially are based on boolean logic. This combinational logic is formed primarily from logical "and," "or" and "invert" functions. Memory elements are typically implemented with flip flops and latches. Normally, the libraries contain a few hundred variations of these fundamental cells. Higher level logic, including arithmetic blocks such as adders and multipliers, is constructed from combinations of these standard cells.

Designers commonly employ standard cell libraries due to the robustness and flexibility of the libraries. This saves time and money by reducing product development cycle time. Additionally, risk is reduced by using predesigned, pretested and precharacterized standard cell libraries.

However, an integrated circuit designed with standard cells often results in an undesirable signal skew. For example, an ideal signal waveform may have a 50/50 or 50% duty cycle, where the amount of time the signal is high is equal to the amount of time the signal is low in a given period. Signal skew, also referred to herein as duty cycle distortion, occurs when the amount of time the signal is high is substantially larger or smaller than the amount of time the signal is low in a given period of the waveform. For example, an ideal waveform having a period of 10 ns (nanoseconds) may have a 5 ns-high/5 ns-low pattern, while a waveform that is skewed may have a 6 ns-high/4 ns-low pattern, resulting in a signal skew of 2 ns.

Previous attempts to solve this problem involved making customized cells, hand-modifying existing standard cells, and utilizing manual place and route modifications to tune a given circuit. U.S. Pat. Nos. 6,690,202 and 6,507,220 describe circuitry for correcting or preventing duty cycle distortion through equating signal voltage to a logic threshold voltage of the integrated circuit. U.S. Pat. No. 6,411,145 describes a circuit configured to correct a duty cycle through differential pairs of transistors configured to change a DC level of the inputs of the integrated circuit. U.S. Pat. No. 5,757,218 describes a duty cycle correction circuit having a comparator circuit and a control circuit. JP Patent Publication Nos. 2003-152078 and 08-077227 describe the use of RC effects in changing the total delay of a cell.

These techniques force the integrated circuit designer to depart from the standard design flow methods used in standard cell integrated circuit designs. The requirement of manually customizing cells or modifying the circuit layout can lengthen and complicate design cycle times, possibly adding extra risk, cost and schedule delay. Thus, a need remains for further improvements in signal skew adjustment in digital circuitry of an integrated circuit.

SUMMARY OF THE INVENTION

The present invention in an illustrative embodiment provides techniques for adjusting the skew of a signal in digital circuitry an integrated circuit through the use of one or more signal skew adjusting cells chosen from a cell library in the design of the integrated circuit.

In accordance with one aspect of the invention, digital circuitry of an integrated circuit comprises at least one digital logic cell and at least one skew adjusting cell. The skew adjusting cell is configured to adjust a skew of a signal in the digital circuitry of the integrated circuit to a desired amount. The digital logic cell and the skew adjusting cell are selected from a cell library.

The skew adjusting cells of the cell library may include basic combinational logic functions and may be designed at the transistor level to provide a skew that is different from that of similar core logic cells. A circuit designer may use these special skew adjusting cells in place of, or in addition to, the regular standard cells in the library to reduce the skew in critical paths of the digital circuitry of the integrated circuit.

In accordance with another aspect of the invention, a method of designing an integrated circuit capable of adjusting a skew of a signal is described. The skew of the signal in digital circuitry of an integrated circuit, having at least one digital logic cell from a cell library, is determined. At least one skew adjusting cell from the cell library is incorporated into the integrated circuit. The at least one skew adjusting cell is configured to adjust the skew of the signal in the digital circuitry of the integrated circuit to a desired amount.

In accordance with a further aspect of the invention, a method of adjusting a skew of a signal in digital circuitry of an integrated circuit is described. A signal is input into digital circuitry of an integrated circuit and transmitted through at least one digital logic cell and at least one skew adjusting cell in the digital circuitry of the integrated circuit. The digital logic cell and the skew adjusting cell are selected from a cell library. The digital logic cell causes a skew in the signal and the skew adjusting cell is configured to adjust the skew of the signal in the digital circuitry of the integrated circuit to a desired amount. The signal is output from the digital circuitry of the integrated circuit having a desired amount of skew.

Advantageously, an illustrative embodiment of the present invention allows circuit designers to minimize signal skew in critical paths of the digital circuitry of the integrated circuit while remaining in the recommended integrated circuit design flow using standard logic cells, with little or no schedule impact.

These and other objects, features, and advantages of the present invention will become apparent from the following detailed description of the illustrative embodiments thereof, which is to be read in connection with the accompanying drawings.

DETAILED DESCRIPTION

As will be described in detail below, the present invention in the illustrative embodiment achieves signal skew adjustment in digital circuitry of an integrated circuit through the use of one or more skew adjusting cells of a cell library.

Figure 1:
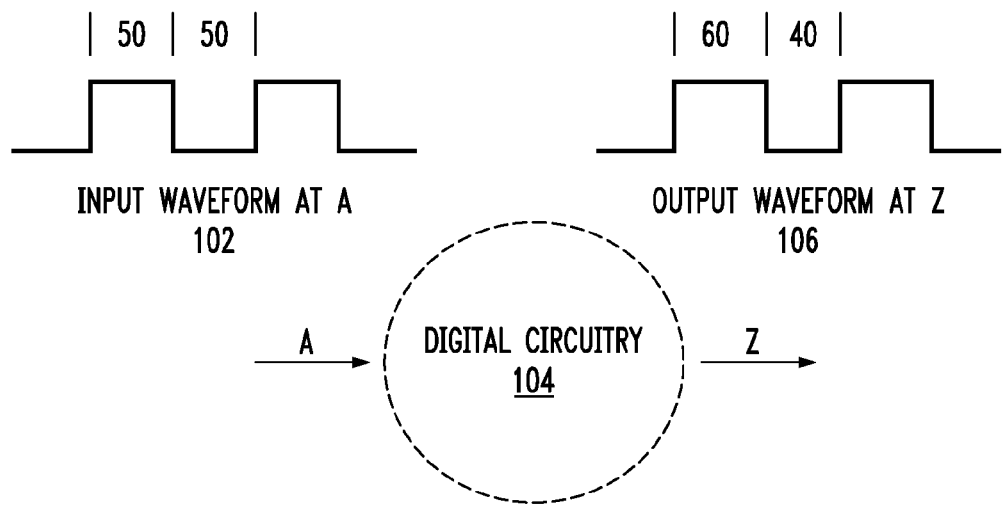
FIG. 1 is a diagram illustrating signal skew in digital circuitry of an integrated circuit.

Referring initially to FIG. 1, a diagram illustrates the concept of signal skew, or duty cycle distortion. An ideal waveform 102, with a 50/50 (50%) duty cycle (zero skew), is an input A to digital circuitry 104 of an integrated circuit. Waveform 102 has zero skew because the amount of time the signal is high and the amount of time the signal is low in a given period are substantially equal. Digital circuitry 104 performs one or more logic operations, and results in an output signal Z illustrated as output waveform 106. Output waveform 106 has a 60/40 duty cycle, where the amount of time the signal is high is greater than the amount of time the signal is low. If this were a 100 MHz signal, with a period of 10 ns, ideal waveform 102 would have a 5 ns-high/5 ns-low pattern. Output waveform 106 would have a 6 ns-high/4 ns-low pattern, resulting in a skew of 2 ns.

Figure 2:
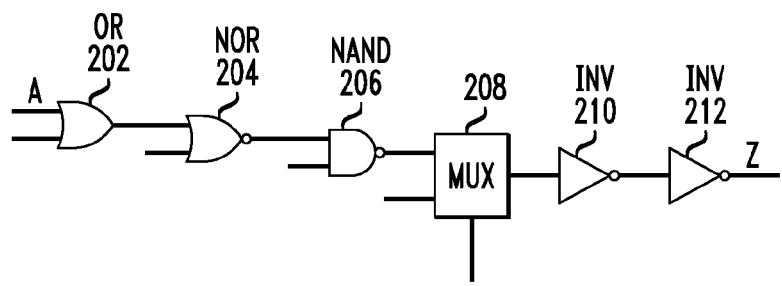
FIG. 2 is a diagram illustrating an example of digital circuitry of an integrated circuit, in which the present invention may be implemented.

Referring now to FIG. 2, a diagram illustrates an example of a chain of digital circuitry in an integrated circuit. Input signal A is transmitted through six logic gates: OR gate 202; NOR gate 204; NAND gate 206; MUX gate 208; and inverters 210 and 212. Inverter 212 generates output signal Z. It is to be appreciated that the particular arrangements of elements shown in FIG. 2, and in other circuitry arrangements described herein, are presented by way of illustrative embodiment only. Other integrated circuits may include alternative or additional elements such as, for example, memory elements and flip-flops, or other types of logic gates. In a perfect design, each circuit element would typically be designed for zero skew. However, in practice high speed and small size requirements often result in circuit elements that have appreciable skew. When many such elements are arranged in series along a given circuit path as shown in FIG. 2, the resulting skew can be undesirably large.

Figure 3:
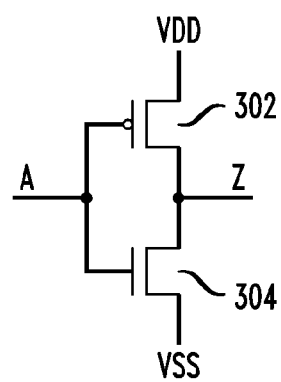
FIG. 3 is a diagram illustrating a transistor implementation of an inverter, utilizable in conjunction with the present invention.

A diagram illustrating a transistor implementation of a MOS inverter is shown in FIG. 3. The MOS inverter of FIG. 3 is utilizable, for example, as inverter 210 or 212 of FIG. 2. In the MOS inverter, a P-channel transistor 302 is interconnected with an N-channel transistor 304. Their common gate is input A of the inverter, while their common drain connection is output Z. VSS represents ground or a lower supply voltage of the circuit, while VDD represents an upper supply voltage. The speed or amount of time it takes for a high-to-low transition of output signal Z depends on the strength of N-channel transistor 304, while the speed or amount of time it takes for a low-to-high transition of output signal Z depends on the strength of P-channel transistor 302. Therefore, the ratio of the strengths of P-channel transistor 302 and N-channel transistor 304 will determine the skew of signal Z that this inverter produces from input signal A.

In most standard cells the strength of a transistor is dependent on its size, more specifically the width/length ratio of the transistor. In many cases the sizes of the P-channel transistor and N-channel transistor are dictated by considerations of cell size and speed. N-channel and P-channel transistors used in standard cells in modern high speed CMOS technology typically have a width between approximately 0.4 μm and 2 μm, and gate lengths between approximately 0.1 μm and 0.2 μm. Depending on the process, a ratio of P-channel transistor width/length to N-channel transistor width/length between approximately 2 and 4 results in minimal skew. However, in most standard cells, this ratio is less than 2 because of the size and speed considerations, which results in a skewed output signal Z.

Figure 4:
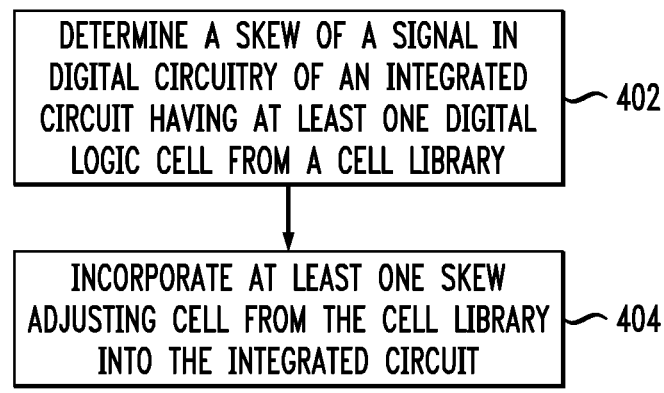
FIG. 4 is a flow diagram illustrating an integrated circuit design methodology which provides signal skew adjustment, according to an embodiment of the present invention.

Referring now to FIG. 4, a flow diagram illustrates an integrated circuit design methodology which provides signal skew adjustment, according to an embodiment of the present invention. The methodology begins at block 402 where a skew of a signal in digital circuitry of the integrated circuit, having at least one digital logic cell from a cell library, is determined. In block 404, at least one skew adjusting cell from the cell library is incorporated into the digital circuitry of the integrated circuit. The at least one skew adjusting cell is configured to adjust the skew of the signal in the digital circuitry to a desired amount. This incorporation step may be the addition of at least one skew adjusting cell to the digital circuitry, or the replacement of at least one digital logic cell with at least one skew adjusting cell in the digital circuitry of the integrated circuit.

Figure 5:
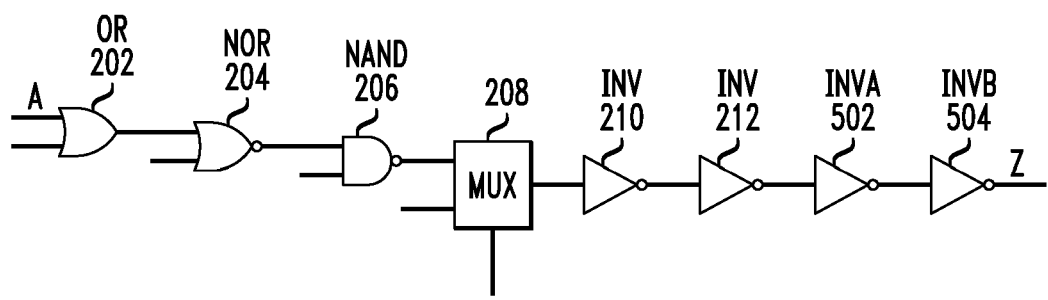
FIG. 5 is a diagram illustrating digital circuitry of an integrated circuit having a skew adjustment stage added to the circuit path of FIG. 2, according to an embodiment of the present invention.

As an example, if the skewed output waveform 106 of FIG. 1 is considered as being produced by the chain of digital circuitry of FIG. 2, then in order to reduce the skew, the speed of the low-to-high transition must be decreased relative to the speed of the high-to-low transition. This can be achieved through the addition of two new inverters, 502 and 504, disposed at the end of the existing circuit path, as shown in FIG. 5, according to an embodiment of the present invention. Inverter 502 is made with an N-channel transistor having a smaller width/length ratio than that of the normal inverters 210 or 212. Since the width/length ratio of the N-channel transistor is decreased, its strength is also decreased, thereby slowing its speed and increasing the time it takes for the high-to-low transition of the inverted form of output signal 106 of FIG. 1.

Inverter 504 is made with a P-channel transistor having a smaller width/length ratio than that of inverters 210 or 212. Since the width/length ratio of the P-channel transistor is decreased, its strength is also decreased, thereby slowing its speed and increasing the time it takes for the low-to-high transition of the inverted form of the signal received from inverter 502. When inverters 502 and 504 are connected in series, as shown in FIG. 5, the resultant output has a signal low-to-high transition that is slowed relative to its high-to-low transition. This slowed low-to-high transition advantageously reduces the skew at output Z.

Inverters 502 and 504 are examples of what are more generally referred to herein as skew adjusting cells. Of course, the invention can utilize a wide variety of other types of such cells, in any combination.

Figure 6:
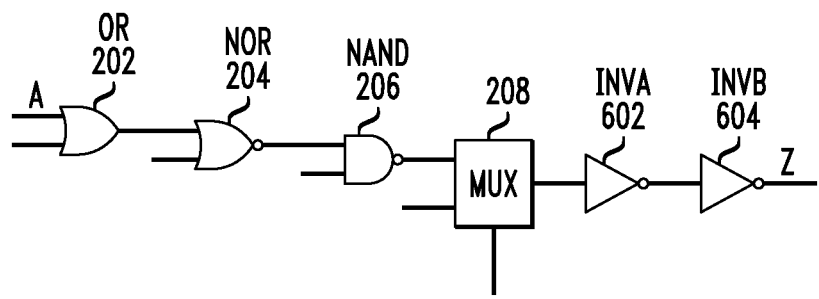
FIG. 6 is a diagram illustrating digital circuitry of an integrated circuit with inverters of the circuit path of FIG. 2 replaced by skew adjusting inverters, according to an embodiment of the present invention.

An alternate solution to correct skew in the present example is to replace existing inverters 210 and 212 in FIG. 2, with inverters 602 and 604 as shown in FIG. 6. In practice, some combination of cell replacement and cell addition may be necessary. Again, while the examples presented herein involve inverters, it will be apparent to those skilled in circuit design that other elements such as NAND, NOR, and other gates, can also be utilized in implementing a skew adjustment technique in accordance with the invention.

A skew adjusting cell as described herein may also perform combinational logic functions. However, the skew resulting from the skew adjusting cell differs from that of a digital logic cell of the cell library having substantially similar logic functions. If a family of such standard cell logic gates is developed, which cover a range of designed-in skews in, for example, +/−100 ps (picosecond) steps or other steps sizes, one or more of such cells could be added during the final design stages of an integrated circuit with little or no impact to physical layout, schedule or cost.

Figure 7:
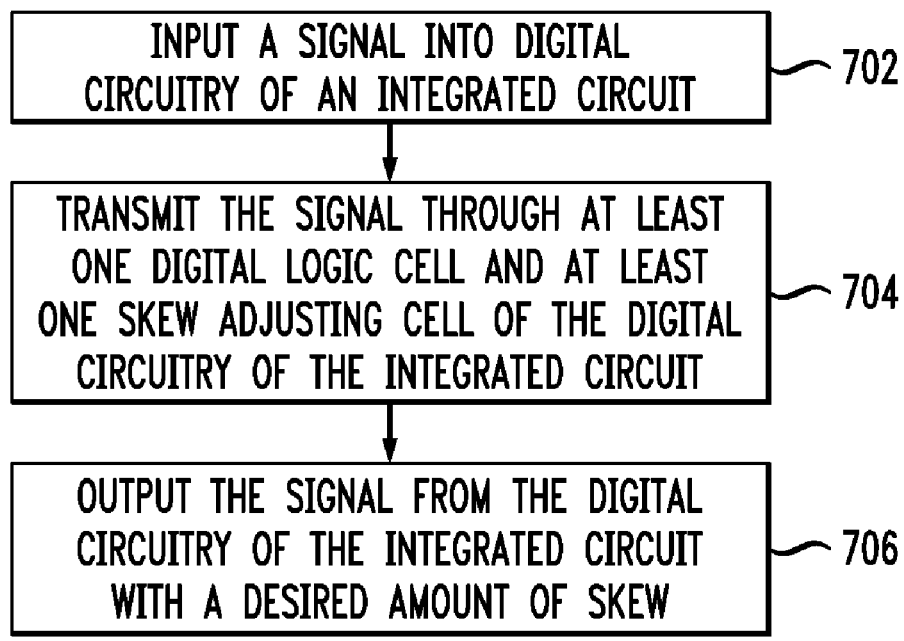
FIG. 7 is a flow diagram illustrating a signal skew adjustment methodology, according to an embodiment of the present invention.

Referring now to FIG. 7, a flow diagram illustrates a signal skew adjustment process, according to an embodiment of the present invention. The process begins at block 702, where a signal is input into digital circuitry of an integrated circuit. In block 704, the signal is transmitted through at least one digital logic cell and at least one skew adjusting cell in the digital circuitry of the integrated circuit. The digital logic cell and the skew adjusting cell are selected from a cell library. The digital logic cell causes a skew of the signal or duty cycle distortion, and the skew adjusting cell is configured to adjust the skew of the signal by a desired amount. The digital logic cell and the skew adjusting cell may be connected in series, with the digital logic cell being arranged before or after the skew adjusting cell, or in other arrangements. The signal is then output from the digital circuitry of the integrated circuit in block 706 with a desired skew. In many cases this desired skew is a skew that is substantially equal to zero, although the described techniques can of course be utilized to produce other desired amounts of skew.

Figure 8:
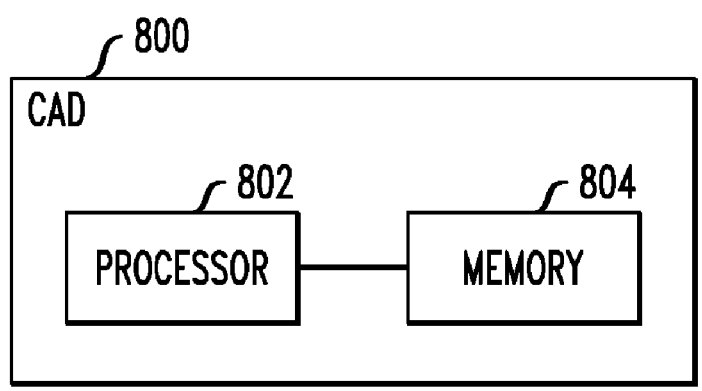
FIG. 8 is a block diagram illustrating an exemplary computer-assisted design instrument suitable for implementing a signal skew adjustment technique, according to an embodiment of the present invention.

Referring now to FIG. 8, a block diagram illustrates an example of a computer-assisted design instrument 800 in which a signal skew adjustment technique of the invention may be implemented. As illustrated, computer-assisted design instrument 800 comprises a processor 802 and a memory 804. One or more of the blocks shown in FIG. 4 may be performed at least in part utilizing software executed by processor 802 and stored in memory 804.

Accordingly, as described herein, the present invention in the illustrative embodiment provides a technique for adjusting a skew of a signal in digital circuitry of an integrated circuit using a skew adjusting cell selected from a cell library.

Additional embodiments of the present invention may incorporate various numbers, combinations and arrangements of digital logic cells, skew adjusting cells and digital circuitry in a given integrated circuit. The additional embodiments may also incorporate skew adjusting cells having varying degrees of adjustment and various logical functions. Further, the integrated circuit may incorporate analog circuitry as well as digital circuitry.

Regarding the integrated circuits in general, a plurality of identical die are typically formed in a repeated pattern on a surface of a semiconductor wafer. Each die may include a device having at least one digital logic cell and at least one skew adjusting cell as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Therefore, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of designing an integrated circuit comprising digital circuitry for signal skew adjustment comprising the steps of:

determining a skew of a signal in the digital circuitry of the integrated circuit having at least one digital logic cell from a cell library; and incorporating at least one skew adjusting cell from the cell library into the digital circuitry of the integrated circuit, wherein the at least one skew adjusting cell is configured to adjust the skew of the signal in the integrated circuit to a desired amount;

wherein the step of incorporating at least one skew adjusting cell from the cell library comprises the step of selecting the at least one skew adjusting cell from a group of skew adjusting cells in the cell library;

wherein each of the skew adjusting cells of the group performs a substantially similar combinatorial logic function to that of the at least one digital logic cell of the cell library;

wherein the skew adjusting cells of the group are designed at a transistor level to provide varying amounts of skew, such that the group of skew adjusting cells covers a range of designed-in skews;

wherein the at least one skew adjusting cell incorporated from the cell library has a skew that differs from that of the at least one digital logic cell of the cell library;

wherein the at least one skew adjusting cell comprises at least one transistor with a smaller width/length ratio than at least one corresponding transistor of the at least one digital logic cell; and wherein at least one of the steps is performed by a computer-assisted design instrument comprising at least one processor coupled to a memory.

2. The method of claim 1, wherein the step of incorporating at least one skew adjusting cell comprises the step of adding the at least one skew adjusting cell from the cell library into the integrated circuit.

3. The method of claim 1, wherein the step of incorporating at least one skew adjusting cell comprises the step of replacing at least one digital logic cell in the integrated circuit with the at least one skew adjusting cell.

4. The method of claim 1, further comprising the step of producing a signal in at least one signal path of the digital circuitry of the integrated circuit having a minimized amount of skew.

5. The method of claim 1, wherein the group of skew adjusting cells cover a range of designed-in skews in at least 100 ps steps.

6. The method of claim 1, wherein the at least one digital logic cell and the at least one skew adjusting cell each comprise a P-channel transistor interconnected with a N-channel transistor.

7. The method of claim 6, wherein the step of incorporating at least one skew adjusting cell comprises the steps of:
adding a first skew adjusting cell from the cell library into the integrated circuit, wherein the first skew adjusting cell comprises a N-channel transistor with a smaller width/length ratio than a corresponding N-channel transistor of the at least one digital logic cell; and
adding a second skew adjusting cell from the cell library into the integrated circuit, wherein the second skew adjusting cell comprises a P-channel transistor with a smaller width/length ratio than a corresponding P-channel transistor of the at least one digital logic cell.

8. The method of claim 1, wherein the step of incorporating at least one skew adjusting cell further comprises the step of replacing a plurality of digital logic cells with a corresponding plurality of skew adjusting cells, wherein the digital logic cell's of the plurality of digital logic cells and the skew adjusting cells of the plurality of skew adjusting cells each comprise a P-channel transistor interconnected with a N-channel transistor.

9. The method of claim 8, wherein the step of replacing a plurality of digital logic cells with a corresponding plurality of skew adjusting cells comprises the steps of:
replacing a first digital logic cell of the plurality of digital logic cells with a first skew adjusting cell of the plurality of skew adjusting cells, wherein the first skew adjusting cell comprises a N-channel transistor with a smaller width/length ratio than a corresponding N-channel transistor of the first digital logic cell; and
replacing a second digital logic cell of the plurality of digital logic cells with a second skew adjusting cell of the plurality of digital logic cells, wherein the second skew adjusting cell comprises a P-channel transistor with a smaller width/length ratio than a corresponding P-channel transistor of the second digital logic cell.

10. A computer-assisted design instrument for designing an integrated circuit comprising digital circuitry for signal skew adjustment, comprising:
a memory; and
at least one processor, coupled to the memory, and operative to perform the steps of: (i) determining a skew of a signal in the digital circuitry of the integrated circuit having at least one digital logic cell from a cell library; and (ii) incorporating at least one skew adjusting cell from the cell library into the digital circuitry of the integrated circuit, wherein the at least one skew adjusting cell is configured to adjust the skew of the signal in the digital circuitry of the integrated circuit to a desired amount;
wherein the step of incorporating at least one skew adjusting cell from the cell library comprises the step of selecting the at least one skew adjusting cell from a group of skew adjusting cells in the cell library;
wherein each of the skew adjusting cells of the group performs a substantially similar combinatorial logic function to that of the at least one digital logic cell of the cell library;
wherein the skew adjusting cells of the group are designed at a transistor level to provide varying amounts of skew, such that the group of skew adjusting cells covers a range of designed-in skews;
wherein the at least one skew adjusting cell incorporated from the cell library has a skew that differs from that of the at least one digital logic cell of the cell library; and
wherein the at least one skew adjusting cell comprises at least one transistor with a smaller width/length ratio than at least one corresponding transistor of the at least one digital logic cell.

11. The instrument of claim 10, wherein the at least one digital logic cell and the at least one skew adjusting cell each comprise a P-channel transistor interconnected with a N-channel transistor.

12. The instrument of claim 11, wherein the step of incorporating at least one skew adjusting cell comprises the steps of:
adding a first skew adjusting cell from the cell library into the integrated circuit, wherein the first skew adjusting cell comprises a N-channel transistor with a smaller width/length ratio than a corresponding N-channel transistor of the at least one digital logic cell; and
adding a second skew adjusting cell from the cell library into the integrated circuit, wherein the second skew adjusting cell comprises a P-channel transistor with a smaller width/length ratio than a corresponding P-channel transistor of the at least one digital logic cell.

13. The instrument of claim 10, wherein the step of incorporating at least one skew adjusting cell further comprises the step of replacing a plurality of digital logic cells with a corresponding plurality of skew adjusting cells, wherein the digital logic cells of the plurality of digital logic cells and the skew adjusting cells of the plurality of skew adjusting cells each comprise a P-channel transistor interconnected with a N-channel transistor, and wherein the step of replacing a plurality of digital logic cells with a corresponding plurality of skew adjusting cells comprises the steps of:
replacing a first digital logic cell of the plurality of digital logic cells with a first skew adjusting cell of the plurality of skew adjusting cells, wherein the first skew adjusting cell comprises a N-channel transistor with a smaller width/length ratio than a corresponding N-channel transistor of the first digital logic cell; and
replacing a second digital logic cell of the plurality of digital logic cells with a second skew adjusting cell of the plurality of digital logic cells, wherein the second skew adjusting cell comprises a P-channel transistor with a smaller width/length ratio than a corresponding P-channel transistor of the second digital logic cell.

14. An article of manufacture for designing an integrated circuit comprising digital circuitry for signal skew adjustment, utilizing a computer-assisted design instrument, comprising a machine readable medium containing one or more programs which when executed implement the steps of:
determining a skew of a signal in the digital circuitry of the integrated circuit having at least one digital logic cell from a cell library; and
incorporating at least one skew adjusting cell from the cell library into the digital circuitry of the integrated circuit, wherein the at least one skew adjusting cell is configured to adjust the skew of the signal in the digital circuitry of the integrated circuit to a desired amount;
wherein the step of incorporating at least one skew adjusting cell from the cell library comprises the step of selecting the at least one skew adjusting cell from a group of skew adjusting cells in the cell library;
wherein each of the skew adjusting cells of the group performs a substantially similar combinatorial logic function to that of the at least one digital logic cell of the cell library;

wherein the skew adjusting cells of the group are designed at a transistor level to provide varying amounts of skew, such that the group of skew adjusting cells covers a range of designed-in skews;

wherein the at least one skew adjusting cell incorporated from the cell library has a skew that differs from that of the at least one digital logic cell of the cell library; and wherein the at least one skew adjusting cell comprises at least one transistor with a smaller width/length ratio than at least one corresponding transistor of the at least one digital logic cell.

15. The article of claim 14, wherein the at least one digital logic cell and the at least one skew adjusting cell each comprise a P-channel transistor interconnected with a N-channel transistor.

16. The article of claim 15, wherein the step of incorporating at least one skew adjusting cell comprises the steps of:

adding a first skew adjusting cell from the cell library into the integrated circuit, wherein the first skew adjusting cell comprises a N-channel transistor with a smaller width/length ratio than a corresponding N-channel transistor of the at least one digital logic cell; and adding a second skew adjusting cell from the cell library into the integrated circuit, wherein the second skew adjusting cell comprises a P-channel transistor with a smaller width/length ratio than a corresponding P-channel transistor of the at least one digital logic cell.

17. The article of claim 14, wherein the step of incorporating at least one skew adjusting cell further comprises the step of replacing a plurality of digital logic cells with a corresponding plurality of skew adjusting cells, wherein the digital logic cells of the plurality of digital logic cells and the skew adjusting cells of the plurality of skew adjusting cells each comprise a P-channel transistor interconnected with a N-channel transistor, and wherein the step of replacing a plurality of digital logic cells with a corresponding plurality of skew adjusting cells comprises the steps of:

replacing a first digital logic cell of the plurality of digital logic cells with a first skew adjusting cell of the plurality of skew adjusting cells, wherein the first skew adjusting cell comprises a N-channel transistor with a smaller width/length ratio than a corresponding N-channel transistor of the first digital logic cell; and replacing a second digital logic cell of the plurality of digital logic cells with a second skew adjusting cell of the plurality of digital logic cells, wherein the second skew adjusting cell comprises a P-channel transistor with a smaller width/length ratio than a corresponding P-channel transistor of the second digital logic cell.

* * * * *